(12) United States Patent
Hsiao

(10) Patent No.: US 10,743,407 B2
(45) Date of Patent: Aug. 11, 2020

(54) CONDUCTIVE STRUCTURE WITH SELF-HEALING PROPERTIES AND METHOD FOR MAKING SAME

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Wen-Hsin Hsiao, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(*) Notice: Subject to any disclaimer, the term of this patent is extended or adjusted under 35 U.S.C. 154(b) by 0 days.

(21) Appl. No.: 16/294,562

(22) Filed: Mar. 6, 2019

(65) Prior Publication Data
US 2020/0187348 A1 Jun. 11, 2020

(30) Foreign Application Priority Data
Dec. 5, 2018 (CN) .......................... 2018 1 1478671

(51) Int. Cl.
*H05K 1/02* (2006.01)
*H05K 1/18* (2006.01)
*H05K 1/11* (2006.01)
*H05K 1/09* (2006.01)
*H05K 3/40* (2006.01)

(52) U.S. Cl.
CPC .......... *H05K 1/0271* (2013.01); *H05K 1/0212* (2013.01); *H05K 1/092* (2013.01); *H05K 1/11* (2013.01); *H05K 1/189* (2013.01); *H05K 3/40* (2013.01); *H05K 2201/026* (2013.01); *H05K 2201/0323* (2013.01); *H05K 2201/062* (2013.01)

(58) Field of Classification Search
CPC ................. H05K 1/0292; H05K 3/225; H05K 2203/0445; H05K 2203/173
See application file for complete search history.

(56) References Cited

U.S. PATENT DOCUMENTS

| | | | |
|---|---|---|---|
| 8,999,200 B2* | 4/2015 | Bandyopadhyay | C08K 3/04 252/500 |
| 2012/0183770 A1* | 7/2012 | Bosnyak | B82Y 30/00 428/367 |
| 2016/0181626 A1* | 6/2016 | Madabusi | H01M 8/0239 429/105 |
| 2016/0360612 A1* | 12/2016 | Iwase | H05K 3/225 |

* cited by examiner

*Primary Examiner* — Hoa C Nguyen
(74) *Attorney, Agent, or Firm* — ScienBiziP, P.C.

(57) ABSTRACT

A self-healing conductive structure includes a conductive layer and a self-healing layer on at least one surface of the conductive layer. The self-healing layer includes a substrate and carbon nanotubes in the insulating matrix, the layer having low viscosity at higher temperatures. When there is a crack in the conductive layer, the self-healing layer flows into the crack, and the carbon nanotubes then in the crack are rearranged under an electric field to repair conductivity. Service life of the conductive structure is improved and signals generated by the conductive structure retain integrity. A method for making the self-healing conductive structure is also provided.

17 Claims, 12 Drawing Sheets

US 10,743,407 B2

CONDUCTIVE STRUCTURE WITH SELF-HEALING PROPERTIES AND METHOD FOR MAKING SAME

FIELD

The subject matter herein generally relates to electrically conductive structures.

BACKGROUND

Conductive structures (such as flexible circuit boards) generally include different layers of materials which are different in elasticity, and the conductive layers in the conductive structures are thin. When the conductive structure is under physical or thermal stresses, the conductive layers may crack and moisture or oxygen may permeate into the conductive structure through the cracks. Life of the conductive structures may be shortened or the conductive structure may function abnormally.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1A:
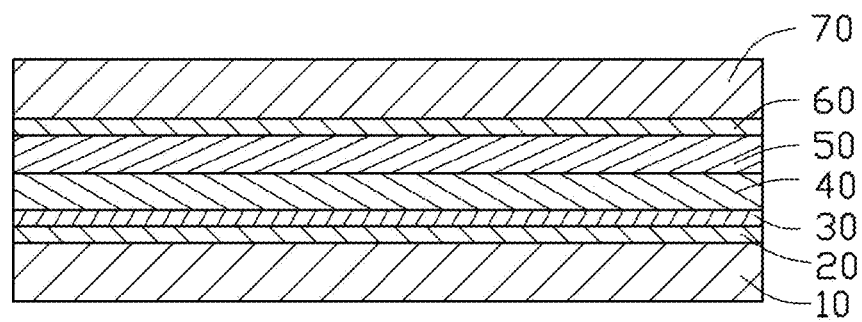
FIGS. 1A and 1B are cross-sectional views showing a self-healing conductive structure according to a first embodiment, with a crack and without a crack, respectively.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

As shown in FIG. 1A, a self-healing conductive structure 100 according to an embodiment of this disclosure includes a substrate layer 10, a first adhesive layer 20, a heating layer 30, a conductive layer 40, a self-healing layer 50, a second adhesive layer 60, and a cover layer 70. The heating layer 30 is bonded to a surface of the substrate layer 10 by the first adhesive layer 20. The cover layer 70 is bonded to the self-healing layer 50 by the second adhesive layer 60. The conductive layer 40 is sandwiched between the self-healing layer 50 and the heating layer 30.

In an embodiment, the self-healing conductive structure 100 may be a flexible circuit board. A material of the substrate layer 10 and a material of the cover layer 70 may be polycarbonate (PC), polymeric methyl methacrylate (PMMA), polyethylene glycol terephthalate (PET) or polyimide (PI), and the like. A material of the first adhesive layer 20 and the second adhesive layer 60 may be polyurethane (PU), acrylic or silicon, and the like.

Figure 1B:
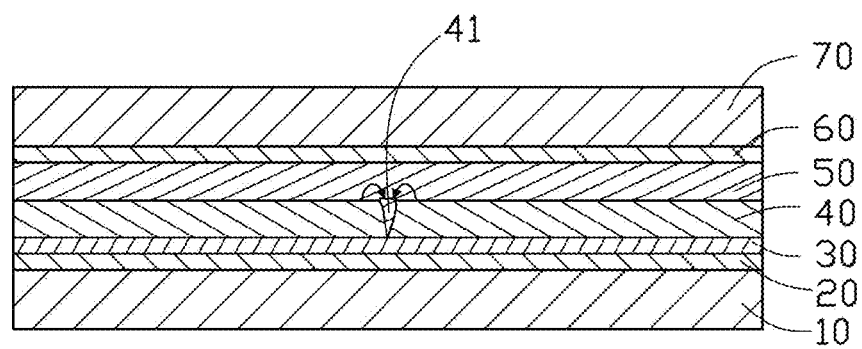

As shown in FIG. 1B, when a crack 41 is formed in the conductive layer 40, substance of the self-healing layer 50 near the proximity of the crack 41 flows into the crack 41 of the conductive layer 40.

Figure 1C:
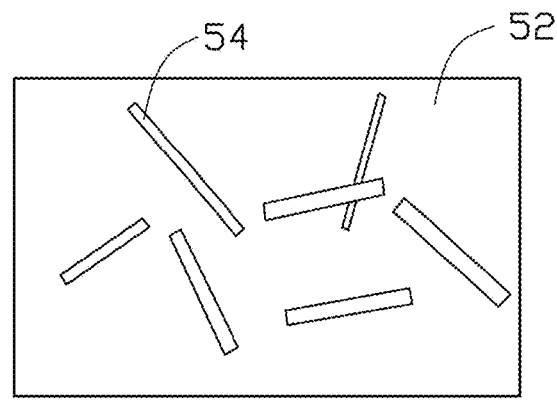
FIGS. 1C and 1D are views showing an alignment of carbon nanotubes in an insulating matrix, in absence of an electric field and in the presence of an electric field, respectively.

Referring to FIG. 1C, the self-healing layer 50 includes an insulating substrate 52 and carbon nanotubes 54 distributed in the insulating substrate 52. The insulating substrate 52 has low viscosity at higher temperatures. When there is no electric field, the carbon nanotubes 54 are randomly arranged in the insulating matrix 52.

Figure 1D:
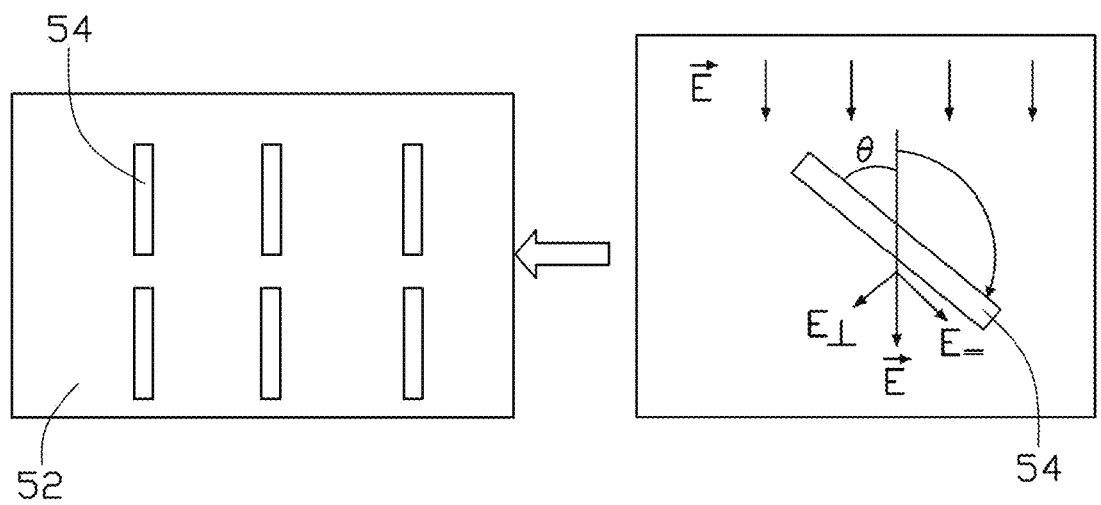

Referring to FIG. 1D, under an electric field E, an inclination angle θ is defined between a longitudinal direction of one of the carbon nanotubes 54 and the direction of the electric field E. The electric filed E can be divided into two vectors: an electric field component $E_=$ being parallel to the longitudinal direction of the carbon nanotube 54 and an electric field component $E_\perp$ being perpendicular to the longitudinal direction of the carbon nanotube 54. The electric field component $E_\perp$ being perpendicular to its longitudinal direction causes the carbon nanotube 54 to have a momentum to rotate perpendicularly to its longitudinal direction, and under the momentum, the carbon nanotube 54 is rotated to be approximately parallel to the direction of the electric field E. Therefore, each carbon nanotube 54 may be sequentially arranged in the insulating substrate 52 in the direction of the electric field E, so that conductivity may be restored to the conductive layer 40. Thus, a lifetime of a device using the self-healing conductive structure 100 is prolonged.

In one embodiment, the insulating substrate 52 may be made of polyethylene (PE), a melting point of the polyethylene is from 80° C. to 100° C. Alternatively, the insulating substrate 52 may be made of phenolic resin (PF), a melting point of the phenolic resin is from 60° C. to 100° C. In other embodiments, the insulating substrate 52 may also be made of other resin materials having a lower melting point to allow the self-healing layer 50 to have good fluidity at low temperatures.

In one embodiment, the carbon nanotubes 54 are multi-walled carbon nanotubes (MWCNTs). The multi-walled carbon nanotubes 54 have a diameter of 20 nm and a length of 10 μm. A mass fraction of the multi-walled carbon nanotubes 54 in the self-healing layer 50 is from 20% to 35%. In other embodiments, the carbon nanotubes 54 may also be single-walled carbon nanotubes (SWCNTs).

In one embodiment, to further facilitate the carbon nanotubes 54 flowing into the crack 41 of the conductive layer 40 under the electric field to restore a conduction to the conductive layer 40, polar functional groups are used to treat the carbon nanotubes 54 in a polar manner to obtain oxidized carbon nanotubes 54. The oxidized carbon nanotubes 54 may be hydroxylated carbon nanotubes 54 or carboxylated carbon nanotubes 54, or a mixture of the two.

Figure 2A:
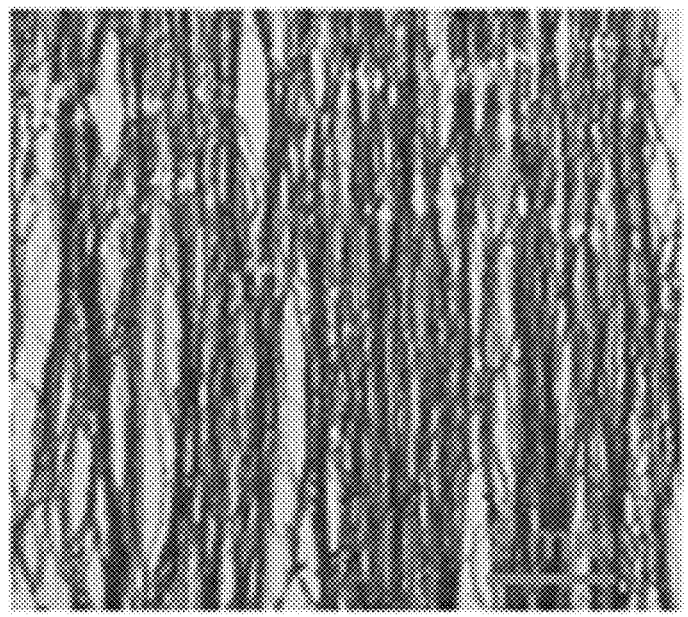
FIGS. 2A and 2B are views of carbon nanotubes in the self-healing layer before oxidation treatment.
Figure 2B:
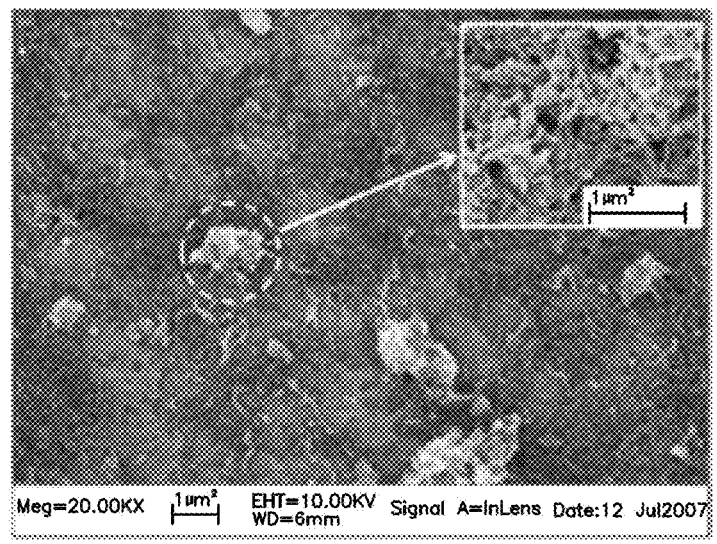
Figure 2C:
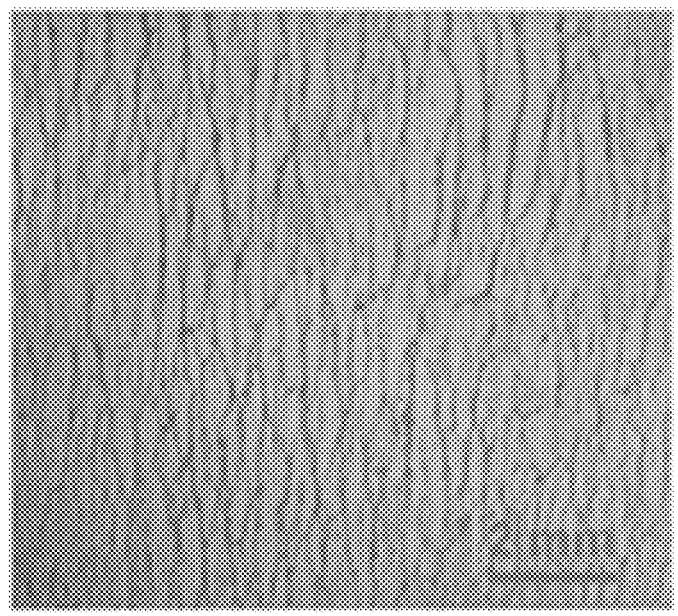
FIGS. 2C and 2D are views of carbon nanotubes in the self-healing layer after oxidation treatment.
Figure 2D:
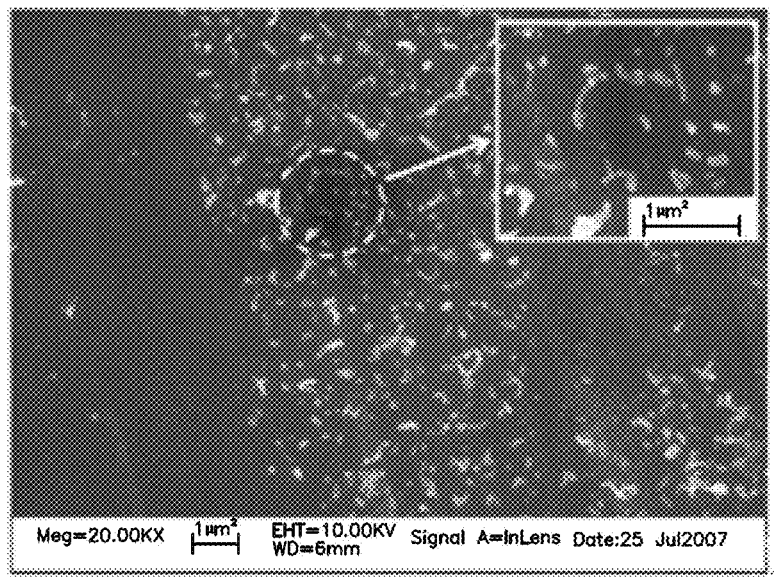

Referring to FIGS. 2A and 2B, the carbon nanotubes 54 which are not oxidized have a significant re-aggregation phenomenon in the self-healing layer 50 (in FIG. 2A, the carbon nanotubes 54 are darker in color, and the insulating matrix 52 is lighter in color; in FIG. 2B, the carbon nanotubes 54 are lighter in color, and the insulating matrix 52 is darker in color). Referring to FIGS. 2C and 2D, the oxidized carbon nanotubes 54 are dispersed without significant re-aggregation (in FIG. 2C, the carbon nanotubes 54 are darker in color, and the insulating matrix 52 is lighter in color; in FIG. 2D, the carbon nanotubes 54 are lighter in color, and the insulating matrix 52 is darker in color).

Figure 3A:
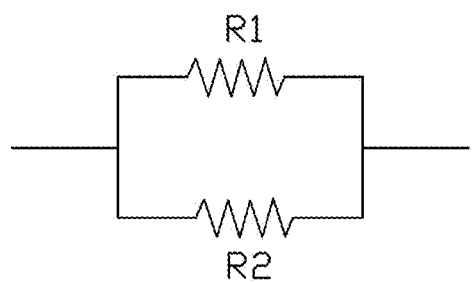
FIGS. 3A and 3B are equivalent circuit diagrams of the self-healing conductive structure shown in FIGS. 1A and 1B.
Figure 3B:
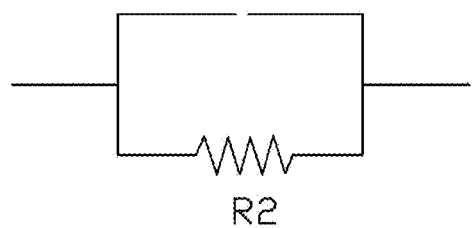

Referring to FIG. 3A, when there is no crack 41 in the conductive layer 40, the heating layer 30 is connected in parallel with the conductive layer 40. A resistance of the conductive layer 40 is R1, a resistance of the heating layer 30 is R2, and a total resistance R after the two are connected in parallel is $R=(R1 \times R2)/(R1+R2)$.

When the conductive layer 40 has a crack 41, the conductive layer 40 corresponds to an open circuit, and the total resistance R becomes large, and R=R2. Joule's law $Q=I^2 Rt$ states that when the conductive layer 40 has a crack 41, the total resistance of the conductive layer 40 and the heating layer 30 is increased, and under the same conditions, the self-healing conductive structure 100 generates Joule heating, then the viscosity of the self-healing layer 50 is decreased by the Joule heating.

When the conductive layer 40 becomes conductive again, the conductive layer 40 and the heating layer 30 are restored to being connected in parallel, the total resistance R becomes small, the Joule heating falls, and the viscosity of the self-healing layer 50 is again increased.

In one embodiment, an electrical conductivity of the conductive layer 40 and an electrical conductivity of the heating layer 30 are both greater than an electrical conductivity of the self-healing layer 50. The conductivity of the self-healing layer 50 is from 40 S/m to 70 S/m; a material of the conductive layer 40 is copper, and an electrical conductivity of copper is about $5.96 \times 10^7$ S/m. A material of the heating layer 30 is graphene, and an electrical conductivity of graphene is $10^6$ S/m. Thus, when there is no crack 41 in the conductive layer 40, there is no electrical conduction between the conductive layer 40 and the self-healing layer 50 under an electric field. In other embodiments, the material of the conductive layer 40 may be a conductive material such as aluminum, gold, or silver. The material of the heating layer 30 may be materials having a high thermal conductivity and a conductivity between the conductivity of the conductive layer 40 and the the conductivity of the self-healing layer 50.

In one embodiment, a tensile strength of the heating layer 30 and a tensile strength of the self-healing layer 50 are both greater than a tensile strength of the conductive layer 40. For example, the conductive layer 40 can be made of copper having a tensile strength of 0.3 GPa to 0.4 GPa, and an elastic modulus of 0.1 TPa; the heating layer 30 is made of graphene having a tensile strength of 130 GPa and an elastic modulus of 1.02 TPa. As such, the heating layer 30 and the self-healing layer 50 will not fracture before the conductive layer 40 yields under the physical or thermal stresses.

In one embodiment, the self-healing layer 50 has a thickness of 20 μm to 1 mm. The conductive layer 40 has a thickness of 20 μm to 1 mm. The heating layer 30 has a thickness of 50 nm. In other embodiments, the thickness of each layer can also be adjusted as needed, and is not limited.

Figure 4:
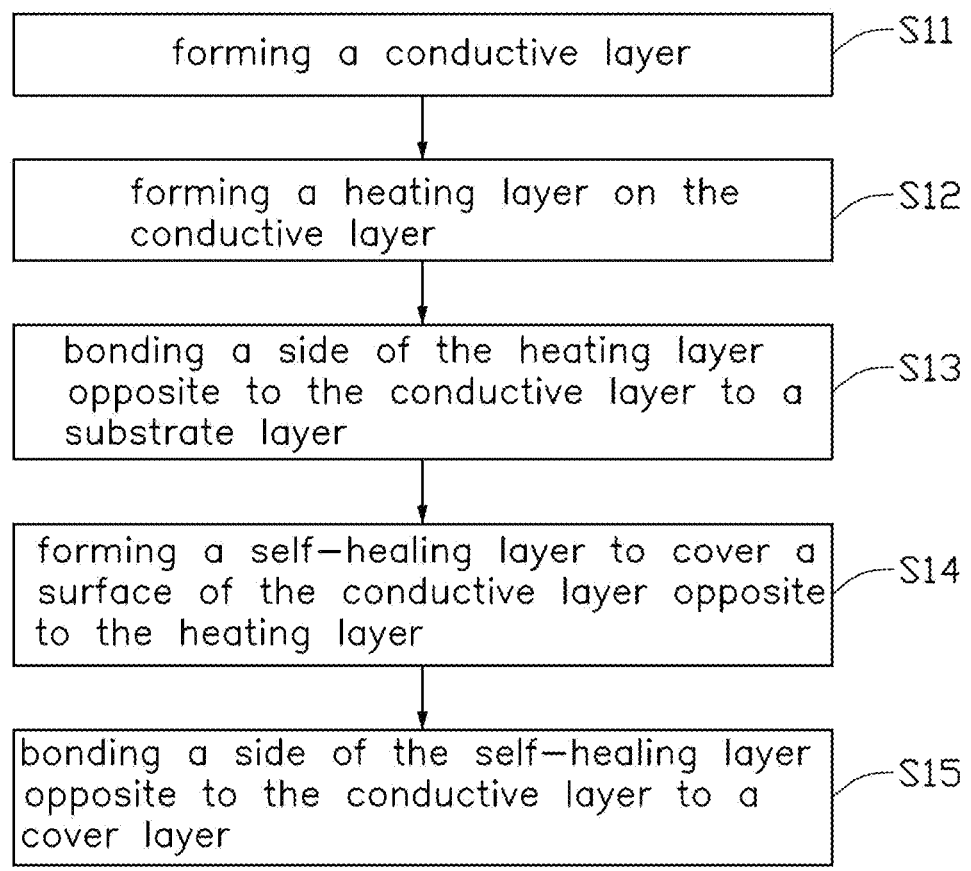
FIG. 4 is a flow chart of a method for making a self-healing conductive structure.

Referring to FIG. 4, a flowchart of as embodiment is disclosed. The method is provided by way of embodiment, as there are a variety of ways to carry out the method. The method described below can be carried out using the configurations illustrated in FIG. 1A for example, and various elements of these figures are referenced in explaining the method. Each block shown in FIG. 4 represents one or more processes, methods, or subroutines, carried out in the method. Additionally, the illustrated order of blocks is by example only and the order of the blocks can change. The method can begin at Block S11.

Block S11: forming a conductive layer 40.

In Block S11: providing a substrate (not shown), and forming a conductive layer 40 having a thickness of 20 μm to 1 mm on a surface of the substrate by a plating method, a lamination method or a coating method. A material of the substrate may be polycarbonate (PC), polymeric methyl methacrylate (PMMA), polyethylene glycol terephthalate (PET) or polyimide (PI), and the like.

Block S12: forming a heating layer 30 on the conductive layer 40.

In Block S12: a graphene layer having a thickness of 50 nm is deposited as the heating layer 30 on a surface of the conductive layer 40 opposite to the substrate by a chemical vapor deposition (CVD) method.

Block S13: bonding a side of the heating layer 30 opposite to the conductive layer 40 to a substrate layer 10.

Block S13 further comprising separating the conductive layer 40 from the substrate, and laminating a side of the heating layer 30 opposite to the conductive layer 40 to the substrate layer 10 by a pressure swing adsorption (PSA) method. The heating layer 30 is laminated to the substrate layer 10 through the first adhesive layer 20. The thickness of the substrate layer 10 may be 500 μm, but is not limited thereto.

Block S14: forming the self-healing layer 50 to cover a surface of the conductive layer 40 opposite to the heating layer 30.

In one embodiment, the self-healing layer 50 includes an insulating substrate 52 and carbon nanotubes 54 distributed in the insulating substrate 52. The insulating substrate 52 is made of polyethylene, and the carbon nanotubes 54 are multi-wall carbon nanotubes. Block S14 may include the following steps: preparing a multi-walled carbon nanotube/polyethylene self-healing material using a solution casting method. First, 50 ml of chloroform was used as a solvent to melt the polyethylene at 60° C. Then, a mass fraction from 20% to 35% of the multi-walled carbon nanotubes 54 were added, and the mixture was ultrasonically vibrated for 30 minutes. The chloroform was then evaporated at 90° C. for 24 hours and evacuated by vacuum for 30 minutes. Finally, the resulting multi-walled carbon nanotubes/polyethylene is coated on the conductive layer 40 and covers at least one surface of the conductive layer 40, and then cured at room temperature to form the self-healing layer 50. The multi-walled carbon nanotubes 54 can be effectively dispersed by the chloroform. If the carbon nanotubes 54 are oxidized multi-walled carbon nanotubes 54 treated with polar functional groups, the block S14 further includes the steps of: mixing concentrated $H_2SO_4$ and concentrated $HNO_3$ with a volume ratio of 1:1; mixing the multi-walled carbon nanotubes; heating to 150° C. for 30 minutes; and then purifying by deionized water to obtain oxidized multi-walled carbon nanotubes 54.

Block S15: bonding a side of the self-healing layer 50 opposite to the conductive layer 40 to a cover layer 70.

In Block S15: The cover layer 70 is laminated to the side of the self-healing layer 50 opposite to the conductive layer 40 by the second adhesive layer 60 by a method of Pressure Swing Adsorption (PSA). The thickness of the cover layer 70 may be 500 μm, but is not limited thereto.

Figure 5:
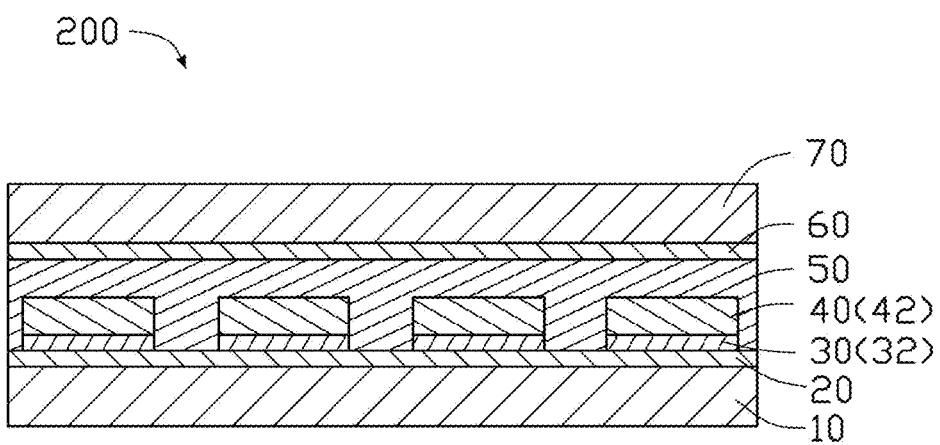
FIG. 5 is a cross-sectional view showing a self-healing conductive structure according to a second embodiment.

Referring to FIG. 5, a self-healing conductive structure 200 of the second embodiment of this disclosure is substantially the same as the self-healing conductive structure 100 of the first embodiment, and each includes a conductive layer 40, a self-healing layer 50 covering at least one surface of the conductive layer 40, and a heating layer 30 on a side of the conductive layer 40 away from the self-healing layer 50 and connected in parallel with the conductive layer 40. The self-healing layer 50 includes an insulating substrate 52 and carbon nanotubes 54 distributed in the insulating substrate 52. The insulating substrate 52 has low viscosity at higher temperatures. When a crack 41 is formed in the conductive layer 40, the Joule thermal fluidity of the self-healing layer 50 due to a temperature of the heating layer 30 is increased. After the self-healing layer 50 flows into the crack 41, the carbon nanotubes 54 in the crack 41 are aligned under the electric field to restore the conductivity of the conductive layer 40.

The self-healing conductive structure 200 of the second embodiment differs from the self-healing conductive structure 100 of the first embodiment as follows. In the first embodiment, the heating layer 30, the conductive layer 40, and the self-healing layer 50 is a continuous layer. In the second embodiment, the conductive layer 40 includes a plurality of electrically conductive blocks 42 spaced apart from each other. The heating layer 30 includes a plurality of heating blocks 32 spaced apart from each other, and each of the heating blocks 32 corresponds to one of the conductive blocks 42. The self-healing layer 50 covers a surface of the conductive block 42 away from the heating block 32 and completely fills gaps between adjacent conductive blocks 42 and gaps between adjacent heating blocks 32. The self-healing conductive structure 200 may be a flexible circuit board, wherein the conductive blocks 42 are connection pads to electrically connecting to other components.

The method for preparing the self-healing conductive structure 200 of the second embodiment is different from the method for preparing the self-healing conductive structure 100 of the first embodiment. In the second embodiment, before coating the self-healing layer 50, the conductive layer 40 and the heating layer 30 are patterned. The self-healing layer 50 covers surfaces of the conductive blocks 42 away from the heating blocks 32 and completely fills the gaps between adjacent conductive blocks 42 and the gaps between adjacent the heating blocks 32.

Figure 6:
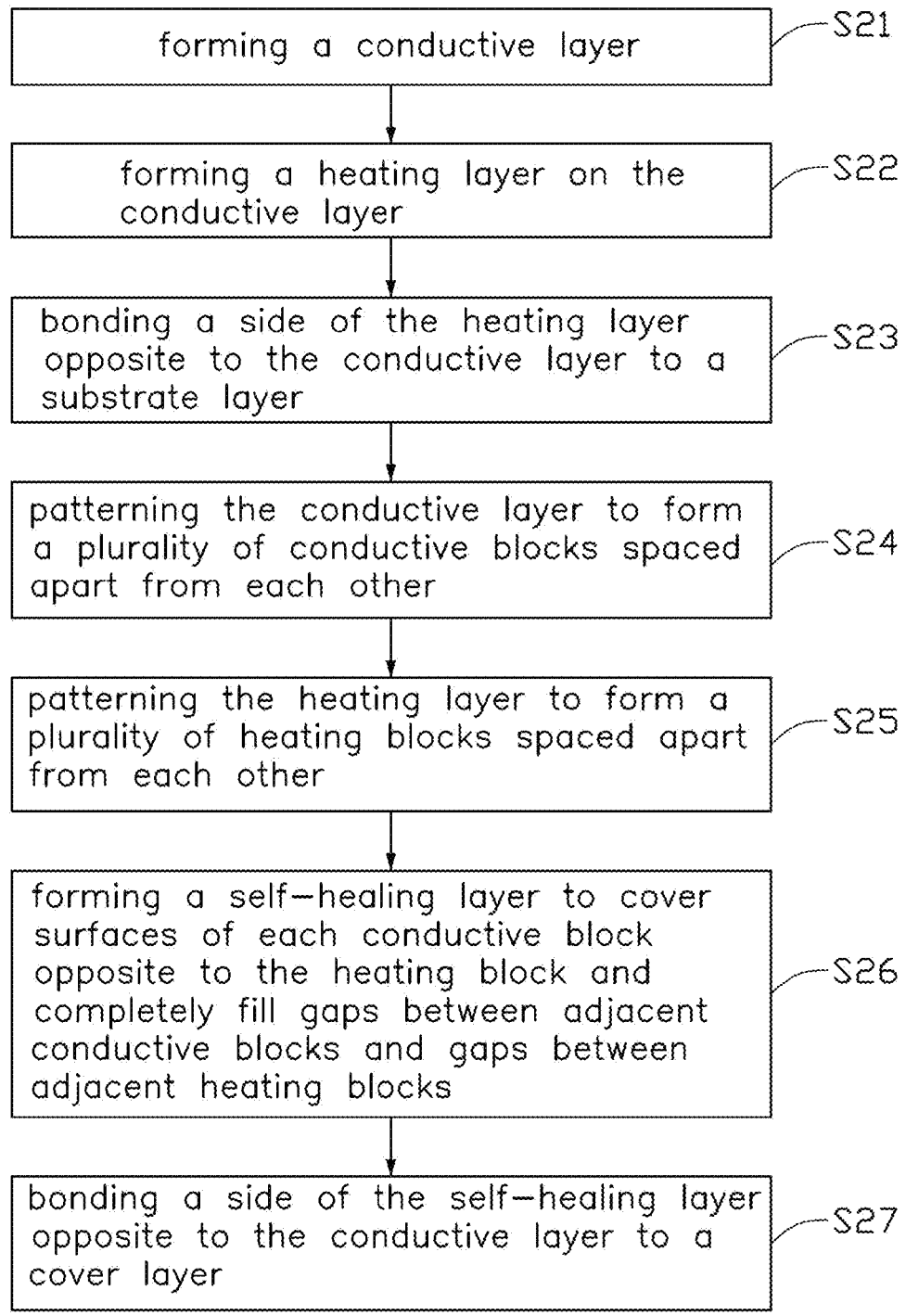
FIG. 6 is a flow chart of a method for making the self-healing conductive structure shown in FIG. 5.

As shown in FIG. 6, a method for preparing the self-healing conductive structure 200 according to a second embodiment of this disclosure includes the following blocks:

Block S21: forming a conductive layer 40.

Block S22: forming a heating layer 30 on a side of the conductive layer 40.

Block S23: bonding a side of the heating layer 30 opposite to the conductive layer 40 to a substrate layer 10.

The blocks S21 to S23 are the same as the above blocks S11 to S13, and are not described herein again.

Block S24: patterning the conductive layer 40 to form a plurality of conductive blocks 42 spaced apart from each other.

In Block S24: the conductive layer 40 is patterned by laser stripping, photolithography (exposure/development) or plasma etching to form the conductive blocks 42 spaced apart from each other.

Block S25: patterning the heating layer 30 to form a plurality of heating blocks 32 spaced apart from each other.

In Block S25: The heating layer 30 is patterned by an $O_2$ plasma method, so that the heating layer 30 forms the heating blocks 32 spaced apart from each other, and each heating block 32 corresponds to one conductive block 42.

Block S26: forming the self-healing layer 50. The self-healing layer 50 covers the surface of each conductive block 40 opposite to the heating block 32, and completely fills the gaps between the adjacent conductive blocks 42 and the gaps between the adjacent heating blocks 32.

In one embodiment, the insulating substrate 52 is made of polyethylene, and the carbon nanotubes 54 are multi-walled carbon nanotubes 54. The block S26 may include the following blocks: preparing a multi-wall carbon nanotube/polyethylene by a solution casting method. First, 50 ml of chloroform was used as a solvent to melt the polyethylene at 60° C. Then, a mass fraction from 20% to 35% of the multi-walled carbon nanotubes 54 were added, and an ultrasonic vibrated to evenly mix for 30 minutes. The chloroform was then evaporated at 90° C. for 24 hours and evacuated by vacuum for 30 minutes. Finally, the obtained multi-walled carbon nanotubes/polyethylene are coated on the conductive layer 40 and covered at least one surface of the conductive layer 40, and then cured at room temperature to form the self-healing layer 50. The multi-walled carbon nanotubes 54 can be effectively dispersed by using chloroform as a solvent. If the carbon nanotubes 54 are oxidized multi-walled carbon nanotubes 54 treated with polar functional groups, the block S14 further includes mixing concentrated $H_2SO_4$ and concentrated $HNO_3$ with a volume ratio of 1:1; mixing the multi-walled carbon nanotubes, and then heating to 150° C. for 30 minutes; and then purifying by deionized water to obtain oxidized multi-walled carbon nanotubes 54.

Block S27: bonding a side of the self-healing layer 50 opposite to the conductive layer 40 to a cover layer 70.

The block S27 is the same as the block S15, and details are not described herein again.

Figure 7:
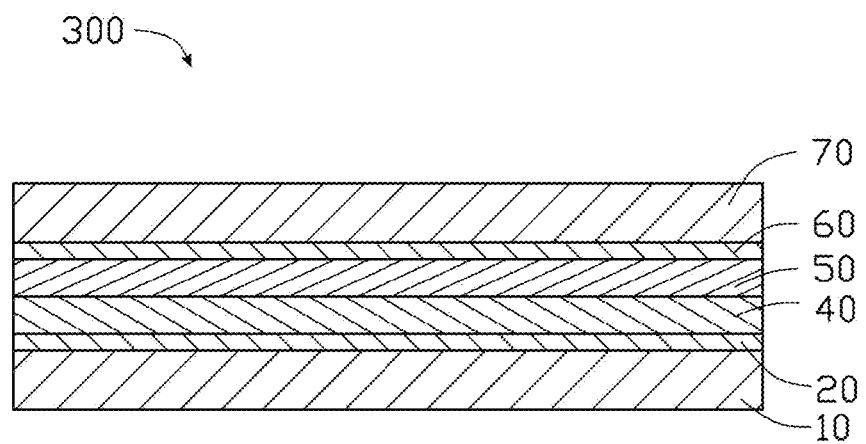
FIG. 7 is a cross-sectional view showing a self-healing conductive structure according to a third embodiment.

Referring to FIG. 7, the self-healing conductive structure 300 of the third embodiment of the present disclosure is disclosed. The third embodiment differs from the self-healing conductive structure 100 of the first embodiment as follows. In the third embodiment, the self-healing conductive structure 300 is not provided with the heating layer 30. When a crack 41 is formed in the conductive layer 40, substance of the self-healing layer 50 flows into the crack 41 by its own fluidity. Under the electric field, the carbon nanotubes 54 in the crack 41 may be aligned to restore the conductivity of the conductive layer 40. The self-healing conductive structure 300 may be a flexible circuit board.

The method for preparing the self-healing conductive structure 300 of the third embodiment of the present disclosure is different from the first embodiment of the present disclosure. In the third embodiment, forming the heating layer 30 on the conductive layer 40, and separating the substrate from the surface of the conductive layer 40 and bonding the side of the heating layer 30 away from the conductive layer 40 to a substrate layer 10 are omitted.

Figure 8:
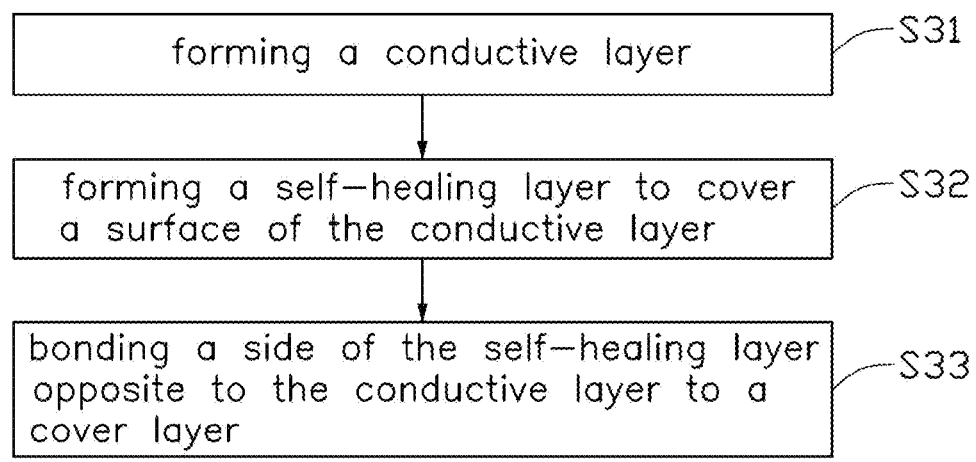
FIG. 8 is a flow chart of a method for making the self-healing conductive structure shown in FIG. 7.

As shown in FIG. 8, a method for preparing the self-healing conductive structure 300 according to a third embodiment of this disclosure includes the following blocks:

Block S31: forming a conductive layer 40.

The block S31 is the same as the above block S11, and details are not described herein again.

Block S32: forming a self-healing layer 50 to cover a surface of the conductive layer 40.

In one embodiment, the insulating substrate 52 is made of polyethylene, and the carbon nanotubes 54 are multi-walled carbon nanotubes 54. The block S32 may include the following blocks: preparing a multi-walled carbon nanotube/polyethylene self-healing material using a solution casting method. First, 50 ml of chloroform was used as a solvent to melt the polyethylene at 60° C. Then, a mass fraction from 20% to 35% of the multi-walled carbon nanotubes 54 were added, and ultrasonically vibrated to evenly mix for 30 minutes. The chloroform was then evaporated at 90° C. for 24 hours and evacuated by vacuum for 30 minutes. Finally, the obtained multi-walled carbon nanotubes/polyethylene are coated on the conductive layer 40 and covered at least one surface of the conductive layer 40, and then cured at room temperature to form the self-healing layer 50. The multi-walled carbon nanotubes 54 can be effectively dispersed by using chloroform as a solvent. If the carbon nanotubes 54 are oxidized multi-walled carbon nanotubes 54 treated with polar functional groups, the block S14 further includes the blocks of: mixing concentrated $H_2SO_4$ and concentrated $HNO_3$ with a volume ratio of 1:1; mixing the multi-walled carbon nanotubes, and then heating to 150° C. for 30 minutes; and then purifying by deionized water to obtain oxidized multi-walled carbon nanotubes 54.

Block S33: bonding a side of the self-healing layer 50 opposite to the conductive layer 40 to a cover layer 70.

The block S33 is the same as the block S15, and details are not described herein again.

Figure 9:
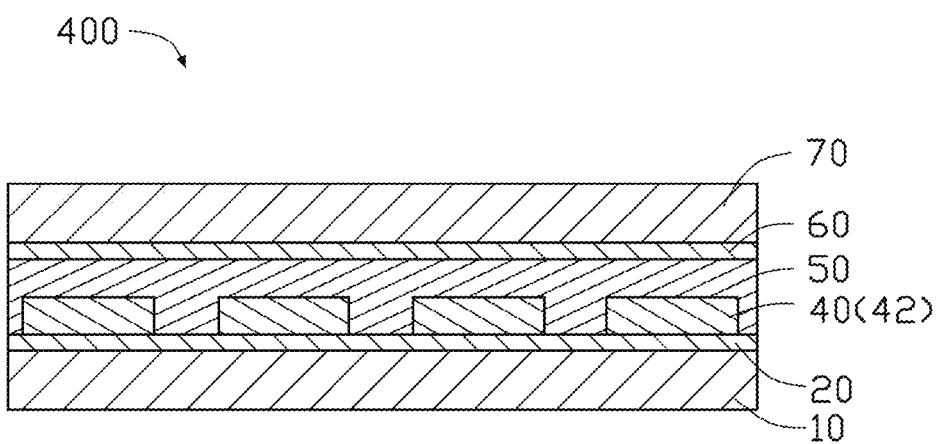
FIG. 9 is a cross-sectional view showing a self-healing conductive structure according to a fourth embodiment.

As shown in FIG. 9, a self-healing conductive structure 400 of the fourth embodiment of the present disclosure is disclosed. The self-healing conductive structure 400 includes a conductive layer 40 and a self-healing layer 50 covering at least one surface of the conductive layer 40. The self-healing layer 50 includes an insulating substrate 52 and carbon nanotubes 54 distributed in the insulating substrate. The insulating substrate 52 has low viscosity at high temperatures. When a crack 41 is formed in the conductive layer 40, the self-healing layer 50 flows into the crack 41, and under the action of the electric field, the carbon nanotubes 54 in the crack 41 are aligned to restore the conductivity of the conductive layer 40. The conductive layer 40 includes a plurality of electrically conductive blocks 42 spaced apart from each other. The self-healing layer 50 covers at least one surface of each conductive block 42 and completely fills the gaps between adjacent conductive blocks 42.

The self-healing conductive structure 400 of the fourth embodiment differs from the self-healing conductive structure 200 as follows. The self-healing conductive structure 400 is not provided with the heating layer 30, and the conductive layer 40 is provided. When the crack 41 is formed, the self-healing layer 50 flows into the crack 41 by its own fluidity, and under the action of the electric field, the carbon nanotubes 54 in the crack 41 are aligned to restore the conductivity of the conductive layer 40. The self-healing conductive structure 400 may be a flexible circuit board, wherein the conductive blocks 42 are connection pads to be electrically connected to other components.

The method for preparing the self-healing conductive structure 400 of the fourth embodiment of the present disclosure is different from the method for preparing the self-healing conductive structure 200 of the second embodiment of this disclosure. In the fourth embodiment, forming the heating layer 30 on the conductive layer 40, separating the substrate from the surface of the conductive layer 40 and bonding the side of the heating layer 30 away from the conductive layer 40 to a substrate layer 10, and t patterning the heating layer 30 are omitted.

Figure 10:
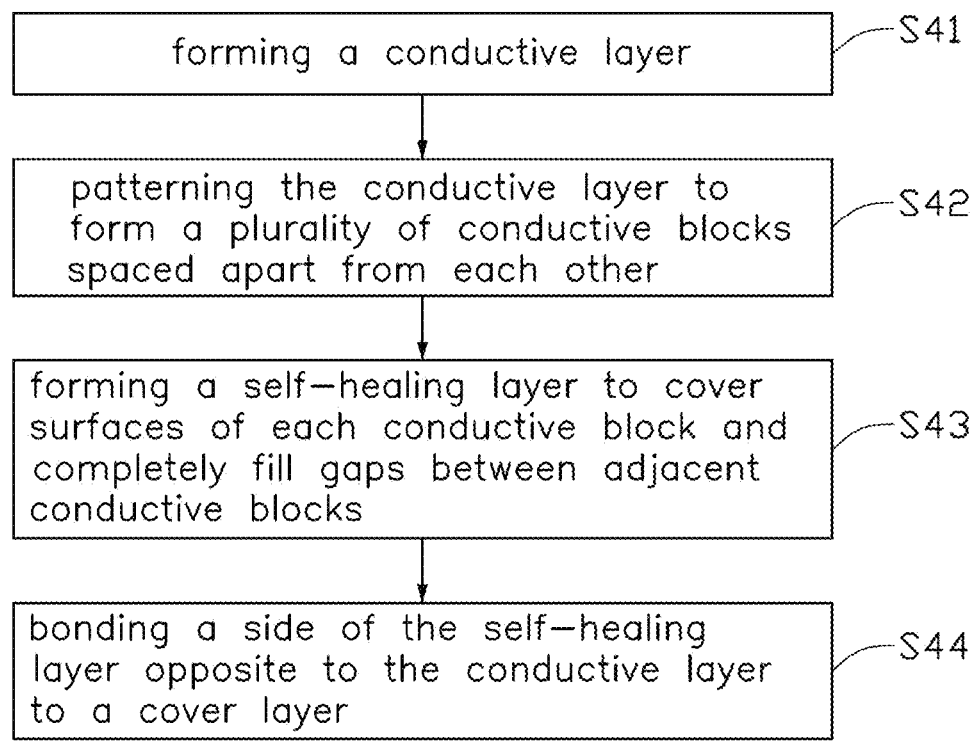
FIG. 10 is a flow chart of a method for making the self-healing conductive structure shown in FIG. 9.

As shown in FIG. 10, a method for making the self-healing conductive structure 400 according to a fourth embodiment of this disclosure includes the following blocks:

Block S41: forming a conductive layer 40.

Block S42: patterning the conductive layer 40 to form a plurality of conductive blocks 42 spaced apart from each other.

The block S42 is the same as the block S24, and details are not described herein again.

Block S43: forming the self-healing layer 50. The self-healing layer 50 covers the surfaces of each conductive block 42 and completely fills the gaps between the adjacent conductive blocks 42.

In one embodiment, the insulating substrate 52 is made of polyethylene, and the carbon nanotubes 54 are multi-walled carbon nanotubes 54. The block S43 may include the following blocks: preparing a multi-walled carbon nanotube/polyethylene self-healing material using a solution casting method. First, 50 ml of chloroform was used as a solvent to melt the polyethylene at 60° C. Then, a mass fraction from 20% to 35% of the multi-walled carbon nanotubes 54 were added, and ultrasonically vibrated to evenly mix for 30 minutes. The chloroform was then evaporated at 90° C. for 24 hours and evacuated by vacuum for 30 minutes. Finally, the obtained multi-walled carbon nanotubes/polyethylene are coated on the conductive layer 40 and cover at least one surface of the conductive layer 40, and then cured at room temperature to form the self-healing layer 50. The multi-walled carbon nanotubes 54 can be effectively dispersed by using chloroform as a solvent. If the carbon nanotubes 54 are oxidized multi-walled carbon nanotubes 54 treated with polar functional groups, the block S14 further includes the blocks of: mixing concentrated $H_2SO_4$ and concentrated $HNO_3$ with a volume ratio of 1:1; mixing the multi-walled carbon nanotubes, and then heating to 150° C. for 30 minutes; and then purifying by deionized water to obtain oxidized multi-walled carbon nanotubes 54.

Block S44: bonding a side of the self-healing layer 50 opposite to the conductive layer 40 to a cover layer 70.

The block S44 is the same as the above Block S15, and details are not described herein again.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A self-healing conductive structure, comprising:
   a conductive layer;
   a self-healing layer covering at least one surface of the conductive layer, the self-healing layer comprising an insulating substrate and carbon nanotubes distributed in the insulating substrate, a material of the insulating substrate is selected based on viscosities of the material at preset temperatures; and
   a heating layer on a side of the conductive layer opposite to the self-healing layer and connected in parallel with the conductive layer.

2. The self-healing conductive structure according to claim 1, wherein the self-healing layer flows into a crack in the conductive layer, and the carbon nanotubes are aligned to increase a conductivity of the conductive layer when an electric field is applied to the self-healing conductive structure.

3. The self-healing conductive structure according to claim 1, wherein the self-healing layer has an electrical conductivity from 40 S/m to 70 S/m.

4. The self-healing conductive structure according to claim 1, wherein the carbon nanotubes are multi-walled carbon nanotubes, and a mass fraction of the multi-walled carbon nanotubes in the self-healing layer is from 20% to 35%.

5. The self-healing conductive structure according to claim 1, wherein the carbon nanotubes are hydroxylated carbon nanotubes or carboxylated carbon nanotubes.

6. The self-healing conductive structure according to claim 1, wherein the conductive layer comprises a plurality of electrically conductive blocks spaced apart from each other, the self-healing layer covers at least one side of each of the conductive blocks away from the heating block, and completely fills gaps between adjacent ones of the conductive blocks.

7. The self-healing conductive structure according to claim 1, wherein the conductive layer comprises a plurality of conductive blocks spaced apart from each other, and the heating layer comprises a plurality of heating blocks spaced apart from each other, each of the plurality of heating blocks corresponds to one of the plurality of conductive blocks, the self-healing layer covers at least one side of each of the plurality of conductive blocks away from the corresponding one of the heating blocks and completely fills gaps between adjacent ones of the conductive blocks and gaps between adjacent ones of the heating blocks.

8. A method of making a self-healing electrically conductive structure, comprising:
   Block S1: forming a conductive layer; and forming a heating layer on the conductive layer; and
   Block S2: forming a self-healing layer; and covering at least one side of the conductive layer away from the heating layer by the self-healing layer, wherein the self-healing layer covers at least one side of the conductive layer, and the self-healing layer comprises an insulating matrix and carbon nanotubes distributed in the insulating matrix.

9. The method according to claim 8, before the Block S2, further comprising patterning the conductive layer to form a plurality of conductive blocks spaced apart from each other.

10. The method according to claim 8, before the Block S2, further comprising bonding a side of the heating layer opposite to the conductive layer to a substrate layer.

11. The method according to claim 10, after the Block S2, further comprising bonding a side of the self-healing layer opposite to the conductive layer to a cover layer.

12. The method according to claim 8, before the Block S2, further comprising forming a heating layer on the conductive layer, and patterning the conductive layer to form a plurality of conductive blocks spaced apart from each other, and the Block S2 comprises covering at least one side of each of the plurality of conductive blocks by the self-healing layer, and filling gaps between adjacent ones of the conductive blocks by the self-healing layer.

13. The method according to claim 12, before patterning the conductive layer to form a plurality of conductive blocks spaced apart from each other, the method further comprising bonding a side of the heating layer away from the conductive layer to a substrate layer.

14. The method according to claim 13, after the Block S2, the method further comprising bonding a side of the self-healing layer away from the conductive layer to a cover layer.

15. The method according to claim 8, before the Block S2, the method further comprising forming a heating layer on the conductive layer, patterning the conductive layer to form a plurality of conductive blocks spaced apart from each other, and patterning the heating layer to form a plurality of heating blocks spaced apart from each other, and each of the plurality of heating blocks corresponds to one of the conductive blocks, and the Block S2 comprising covering at least one side of each of the plurality of conductive blocks away from the corresponding one of the heating blocks by the self-healing layer, and filling gaps between adjacent ones of the conductive blocks and gaps between adjacent ones of the heating blocks by the self-healing layer.

16. The method according to claim 15, before patterning the conductive layer to form a plurality of conductive blocks spaced apart from each other, the method further comprising bonding a side of the heating layer away from the conductive layer to a substrate layer.

17. The method according to claim 16, after the Block S2, the method further comprising bonding a side of the self-healing layer away from the conductive layer to a cover layer.

* * * * *